(12) United States Patent
Yeh et al.

(10) Patent No.: US 6,180,514 B1
(45) Date of Patent: Jan. 30, 2001

(54) METHOD FOR FORMING INTERCONNECT USING DUAL DAMASCENE

(76) Inventors: Wen-Kuan Yeh, 12 Lane 43, Hua-Hsing $1^{st}$ St., Chu-Pei City, Hsin-Chu County; Wen-Jeng Lin, 17F, No. 336, Chung-Cheng Rd., Pan-Chiao City, Tasipei County, both of (TW)

( * ) Notice: Under 35 U.S.C. 154(b), the term of this patent shall be extended for 0 days.

(21) Appl. No.: 09/438,828

(22) Filed: Nov. 12, 1999

(51) Int. Cl.$^7$ ............................................ H01L 21/4763

(52) U.S. Cl. ........................... 438/633; 438/618; 438/687

(58) Field of Search ................................... 438/633, 620, 438/622, 634, 637, 638, 618, 687

(56) References Cited

U.S. PATENT DOCUMENTS 6,001,733 * 12/1999 Huang .................................. 438/633
6,040,243 * 3/2000 Li et al. ................................. 438/687

* cited by examiner

Primary Examiner—David Nelms
Assistant Examiner—Phuc T. Dang

(57) ABSTRACT

A method for forming inter-metal dielectric is disclosed. The method normally includes the following steps. First of all, a semiconductor wafer is provided. Then, forming a first metal layer on a portion of the substrate is carried out. A first dielectric layer is formed on the first metal layer and the substrate. Consequentially a tantalum nitride layer is formed on the first dielectric layer. A first photoresist layer can be formed on the tantalum nitride layer, especially first photoresist layer has a first pattern defining a trench area located over the first metal layer, and has a second pattern defining an etch stop area. The tantalum nitride layer will be etched by the first photoresist layer. A second dielectric layer is formed over the etched tantalum nitride layer and the first dielectric layer. The second photoresist layer can be formed on the second dielectric layer, especially the second photoresist layer has a first pattern substantially aligned with the first pattern of the first photoresist layer, and has a second pattern substantially aligned with the second pattern of the first photoresist layer. Next, etching the second dielectric layer by the second photoresist layer can be achieved, portion of the first dielectric layer over the first metal layer is further etched by the first pattern of the first photoresist layer. Thus trenches are formed in the first dielectric layer and the second dielectric layer. Then the tantalum nitride layer is deposited into the trenches, especially barrier layer is formed on top surface of the trenches. A seed layer is formed on sidewalls of the etched first dielectric layer and the second dielectric layer. Sequentially, the trenches are filled by a second metal layer. Finally, the second metal layer is planarized to expose surface of said second dielectric layer.

14 Claims, 5 Drawing Sheets

METHOD FOR FORMING INTERCONNECT USING DUAL DAMASCENE

BACKGROUND OF THE INVENTION

1. Field of the Invention

The present invention relates about a method for forming interconnect, more particularly using dual damascene for precisely controlling the shape and area of the interconnect.

2. Description of the Prior Art

Currently, demand for integrated circuit (I.C.) has rapidly increased due to widespread use of electronic equipment. In particular, the increasing popularity of some electronic equipment such as, for example, many kinds of computers are gradually increasing the demand for the large or very large semiconductor memories in this modern century and next coming twenty-one century. Therefore, the advanced manufacture technology for improvement fabrication of integrated circuit should be urgently need than before.

Normally, the size and performance of the power IC devices depends critically on a specific at a particular breakdown voltage of the output devices. Since the thickness of semiconductor is usually limited by technological constraints, higher breakdown voltages typically require more layers. However, since the device on resistance is proportional to the expitaxial layer resistivity, higher breakdown voltages have to generally be traded off for limited drive current capability.

Thus, there is a conventional method described as referring with FIG. 1A to 1D, which are the method for forming inter-metal dielectric by using dual damascene for precisely controlling the shape and area of the interconnect. Then, The following description will explain the various steps of one conventional method for forming dual damascene structure by reference FIG. 1.

In the manufacture of a conventional dual damascene structure, there a substrate 100 has a metal layer 120 formed therein as shown in FIG. 1A. An inter-metal dielectric layer 130 and a stop layer 132 are subsequently deposited on the substrate 100. This stop layer 132 is silicon nitride as a trench etching stop layer. Then, another inter-metal dielectric layer 134 is coated on the stop layer 132. A via patterned photoresist layer 140 is formed. Then, an anisotropically etch is performed to etch through inter-metal dielectric layer 134, stop layer 132, and inter-metal dielectric layer 130, as shown in FIG. 1B. Another photoresist layer 142 having a trench line pattern is formed next. Referring to FIG. 1C, trench line pattern 152 is transferred into the inter-metal dielectric layer 134 and ceased at stop layer 132. Then, the photoresist layer 142 is removed. A barrier layer 162 is deposited and a metal layer 160, such as tungsten or copper, is subsequently deposited to fill the via hole and trench line, as shown in FIG. 1D. Finally, the dual damascene structure is completed by using chemical mechanical polishing method to remove excess metal layer.

For 0.18 μm process and beyond, dual damascene process is a key technology to push design rule tightly, but it is difficult to control the process window especially in via and metal trench formation. Thus, good resolution of lithography (misalignment issue) and high selectivity of via etching is the key issue for back end interconnection.

Therefore, within the microelectronics industry, there is an ongoing trend toward miniaturization coupled with higher performance. The scaling of transistors toward smaller dimensions, higher speeds, and low power has resulted in an urgent need for low constant inter-level insulators. Low dielectric constant inter-level dielectrics have already been identified as being critical to the realization of high performance integrated circuits. Thus, there exists a need in the microelectronics industry for a thermally stable, non-corrosive low dielectric constant polymer with good solvent resistance, high glass transition temperature, good mechanical performance and good adhesive properties, particularly to copper.

SUMMARY OF THE INVENTION

In accordance with the present invention, a method is provided for forming interconnect using dual damascene structure that substantially obtains larger lithography process window without etching stop layer, i.e., PR lithography can be well controlled.

It is therefore an objection of this invention that with high height of photoresist and low height of SOG Oxide, via/trench etching is not necessary; thus, plasma damage on low k dielectric layer is avoided.

It is another object of this invention that silicon nitride stop layer is not used because damascene structure can be formed by two steps photoresist lithography. It is still another object of this invention that no via overetch issue (two steps trench/via etching); thus, process window of alignment adjustment (AA) control is improved.

It is yet another object of this invention that combination with low-dielectric constant layer, this process is very compatible with sub-0.18 μm technology.

In the embodiment, the method for forming interconnect, normally concludes the following steps. First of all, a semiconductor wafer is provided. Then, forming a first metal layer on a portion of the substrate is carried out. A first dielectric layer is formed on the first metal layer and the substrate. Consequentially a tantalum nitride layer is formed on the first dielectric layer. A first photoresist layer can be formed on the tantalum nitride layer, especially first photoresist layer has a first pattern defining a trench area located over the first metal layer, and has a second pattern defining an etch stop area. The tantalum nitride layer will be etched by the first photoresist layer. A second dielectric layer is formed over the etched tantalum nitride layer and the first dielectric layer. The second photoresist layer can be formed on the second dielectric layer, sepecially the second photoresist layer has a first pattern substantially aligned with the first pattern of the first photoresist layer, and has a second pattern substantially aligned with the second pattern of the first photoresist layer. Next, etching the second dielectric layer by the second photoresist layer can be achieved, portion of the first dielectric layer over the first metal layer is further etched by the first pattern of the first photoresist layer. Thus trenches are formed in the first dielectric layer and the second dielectric layer. Then the tantalum nitride layer is deposited into the trenches, especially barrier layer is formed on top surface of the trenches. A seed layer is formed on sidewalls of the etched first dielectric layer and the second dielectric layer. Sequentially, the trenches are filled by a second metal layer. Finally, the second metal layer is planarized to expose surface of said second dielectric layer.

BRIEF DESCRIPTION OF THE DRAWINGS

The foregoing aspects and many of the attendant advantages of this invention will become more readily appreciated as the same becomes, better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a number of preferred embodiments directed to semiconductor device, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

Thus, the spirit of the proposed invention can be explained and understood by the following embodiments with corresponding figures. With reference to FIGS. 2A to 2H, the method according to the present invention is schematically shown to include the whole method. It will briefly be noted here that substrate 210 in FIGURES is provided with a substructure of devices formed in the metal layers thereof, and as they are not significant to the invention, they are not described in detail in order not to unnecessarily obscure the present invention.

Figure 1A:
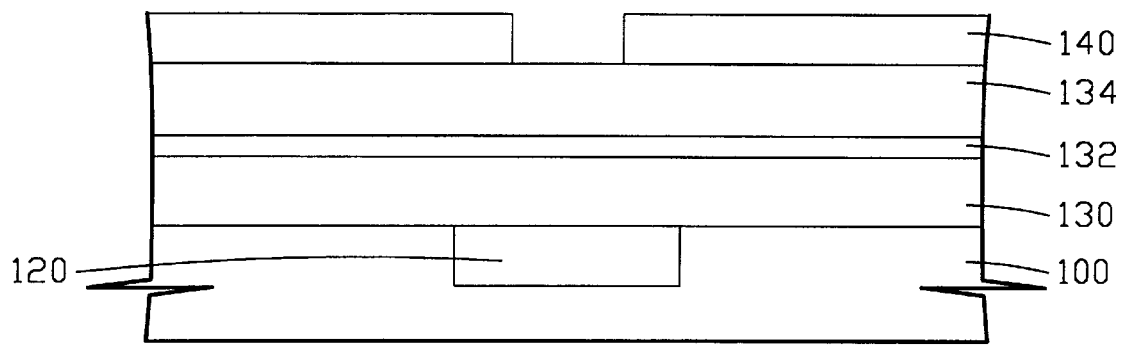
FIGS. 1A to 1D is a diagram schematically illustrating a conventional process for forming inter-metal dielectric using dual damascene.
Figure 1B:
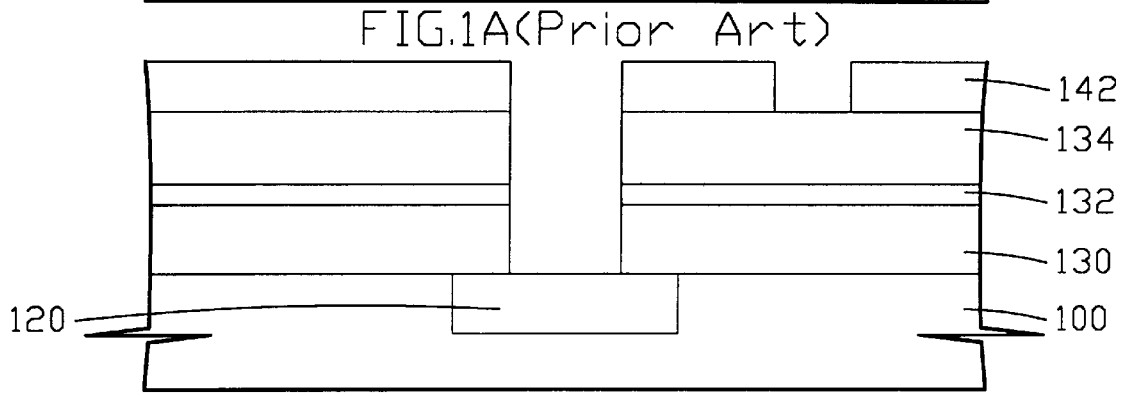
Figure 1C:
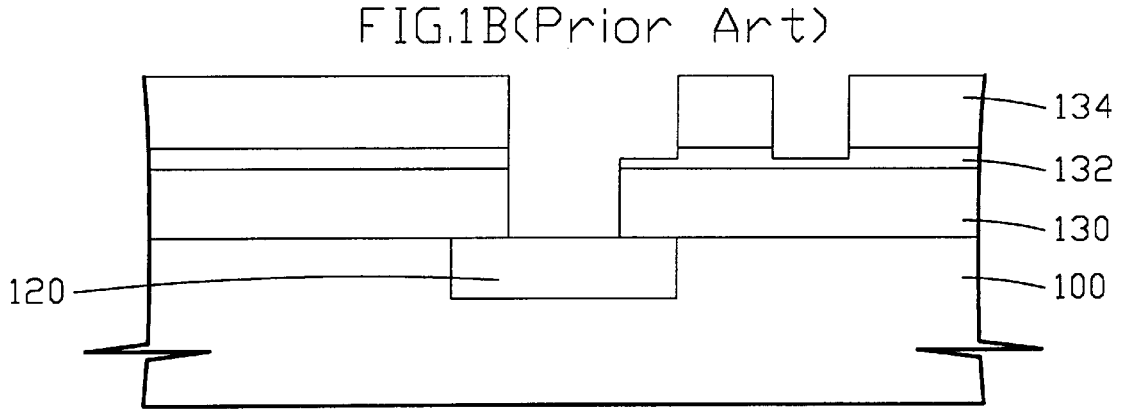
Figure 1D:
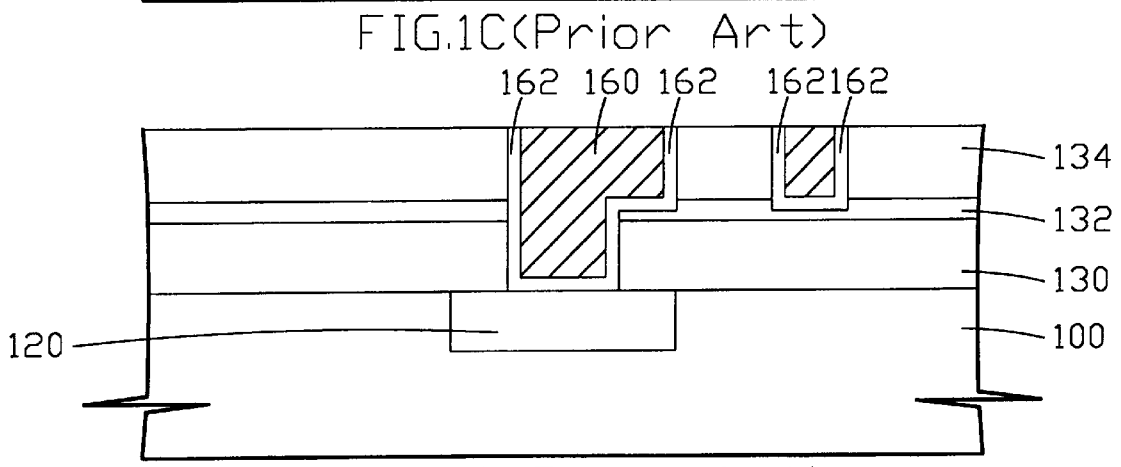
Figure 2A:
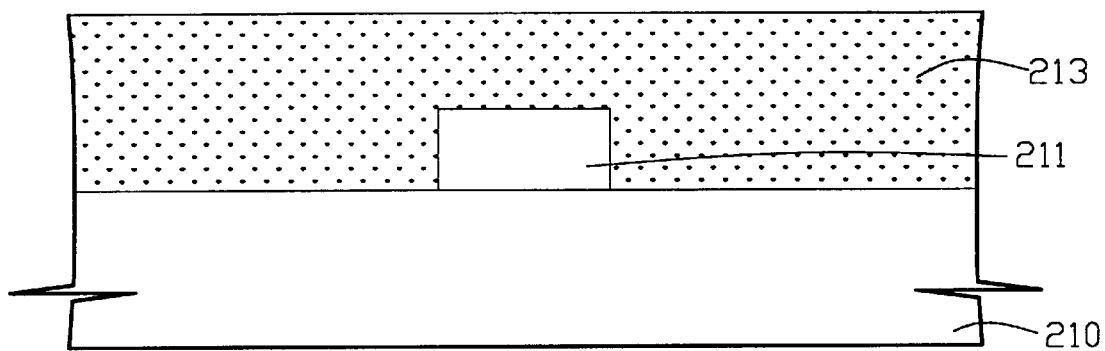
FIGS. 2A to 2H is a diagram schematically illustrating an embodiment for combining the logic circuit and the capacitor circuit according to the invention.

Firstly, as FIG. 2A, a semiconductor substrate 210 is provided. Then, first metal layer 211 is deposited and patterned as a metal line on a portion of the substrate. Consequentially, first dielectric layer 213 is deposited thereupon the patterned conduct layer 210 and the first metal layer 211. This layer 213 is an inter-metal dielectric layer and has a thickness between about 4000 to 12000 angstroms.

Figure 2B:
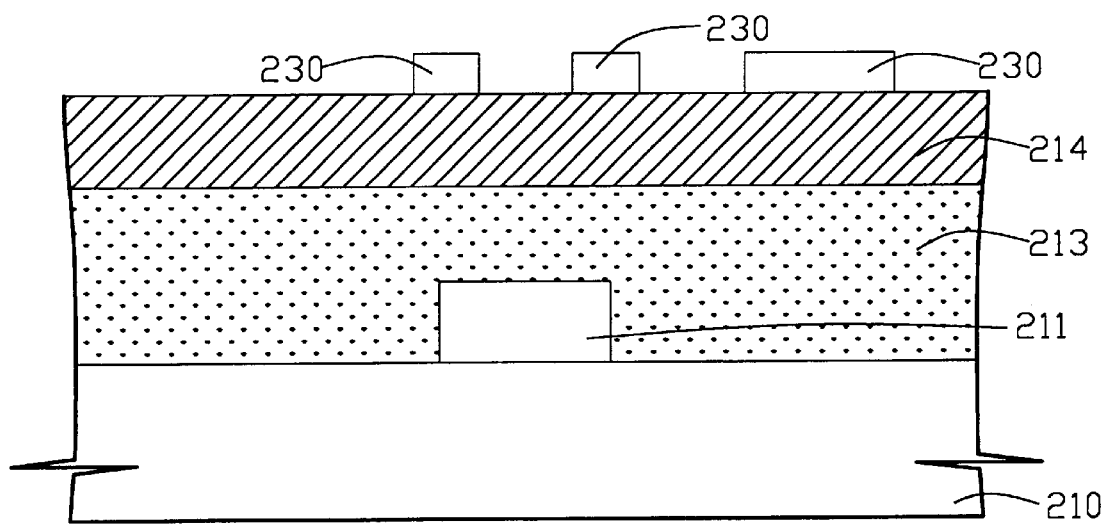

Referring to FIG. 2B, tantalum nitride layer 214 is deposited on first dielectric layer 213 by chemical vapor deposition. Then, first photoresist layer 230 is formed on tantalum nitride layer (specified as barrier layer) 214. First photoresist layer 230 is deposited by any conventional method, such as standard lithographic process with a negative tone contact mask or an image reversal process using a positive toned contact mask. The preferred thickness of this photoresist 230 is between about 0.5 to 1.5 $\mu$m and the preferred width is between about 0.2 to 0.4 $\mu$m. Also, the first photoresist layer 230 has a first pattern defining a trench area located over the first metal layer 211, and has a second pattern defining an etch stop area that is tantalum nitride layer 214.

Figure 2C:
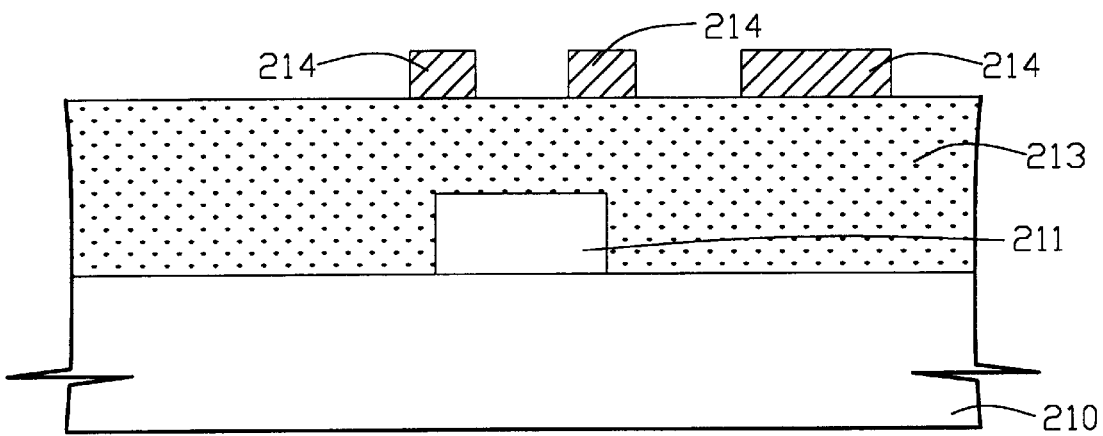

Referring to FIG. 2C, tantalum nitride layer (specified as barrier layer) 214 is etched as a position of hole for via through. This also is carried out by the conventional lithography.

Figure 2D:
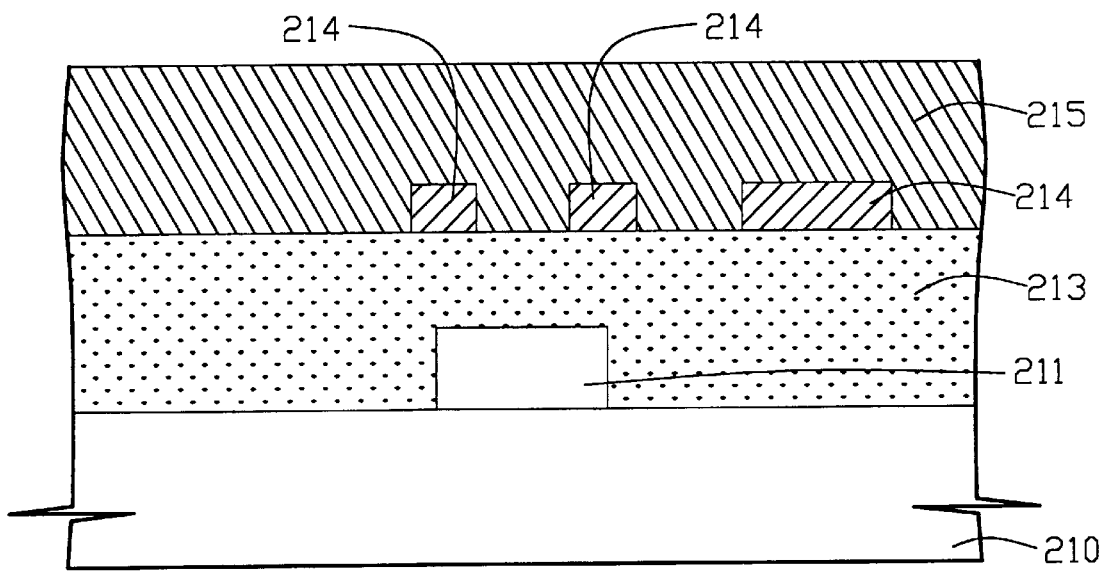

Then, as FIG. 2D, a low-dielectric layer 215 is formed by using conventional spin-on glass process. This layer 215 is an inter-metal dielectric layer and has a thickness between about 4000 to 12000 angstroms. The materials of this layer 215 can be made from any typical and well-known low-dielectric material used in wafer fabrication, but is preferably HSQ. It should be noticed that the height of the dielectric layer 215 is less than the via photoresist 230.

Figure 2E:
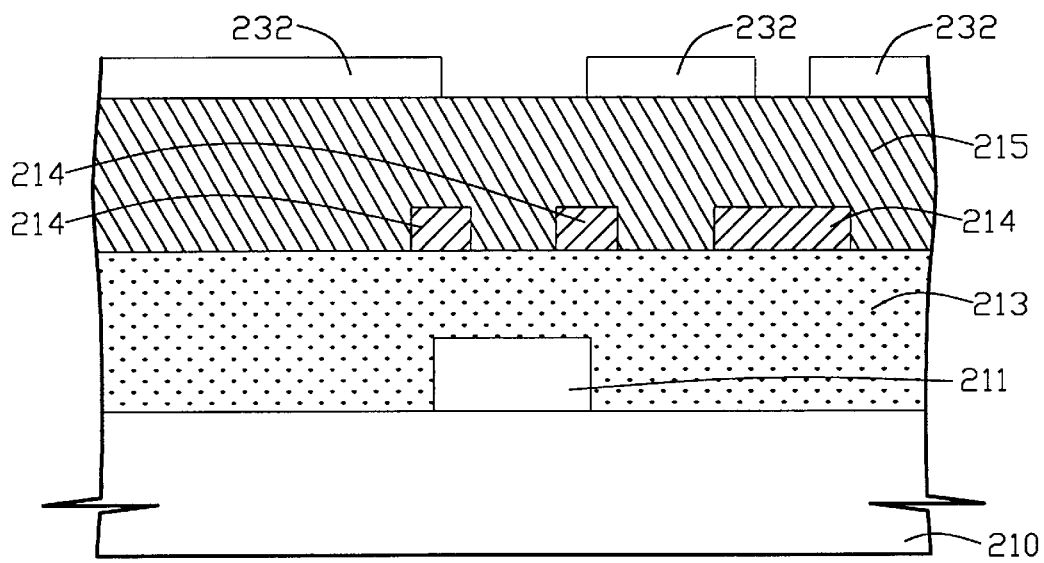

Then, as FIG. 2E, another photoresist layer 232 is formed on the dielectric layer 215. The preferred thickness of this photoresist layer 232 is between about 0.5 to 1.5 $\mu$m. Also, second photoresist layer 232 has a first pattern substantially aligned with the first pattern of the first photoresist layer 230, and has a second pattern substantially aligned with the second pattern of first photoresist layer 230.

Figure 2F:
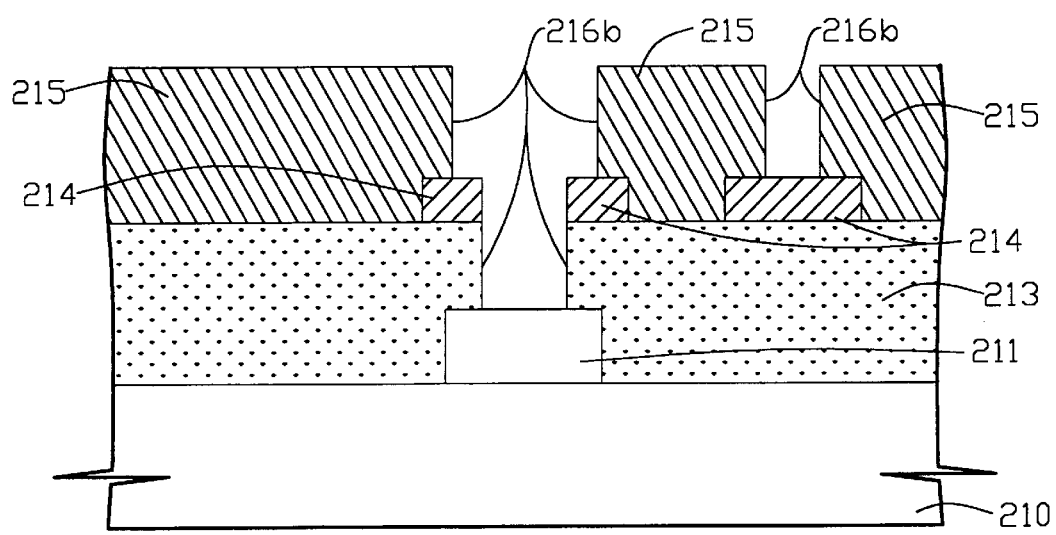

Referring to FIG. 2F, the photoresist layer 232 is patterned as tench 216A and 216B. Here, it is by the same method as the formulation of conventional etching to form as trench for via through. From FIG. 2F, the left side is a longer trench and right side is a shorter trench. On the left side, the etching is stopped at the first metal block 211 and interrupted by tantalum nitride layer (specified barrier layer) 214. Thus, this shape of trench on the upper side is wider than the below side. On the other side, etching will be stopped at tantalum nitride layer 214. The width of this via photoresist 232 is between about 3000 to 50000 angstroms. Then, photoresist 232 is removed by using any conventional method. Therefore, portions of the first dielectric layer 213 over the first photoresist 230 is further etched by the first pattern of the first photoresist layer 230, so that trenches 216$a$ and 216$b$ will be formed in the first dielectric layer and the second dielectric layer 232.

Figure 2G:
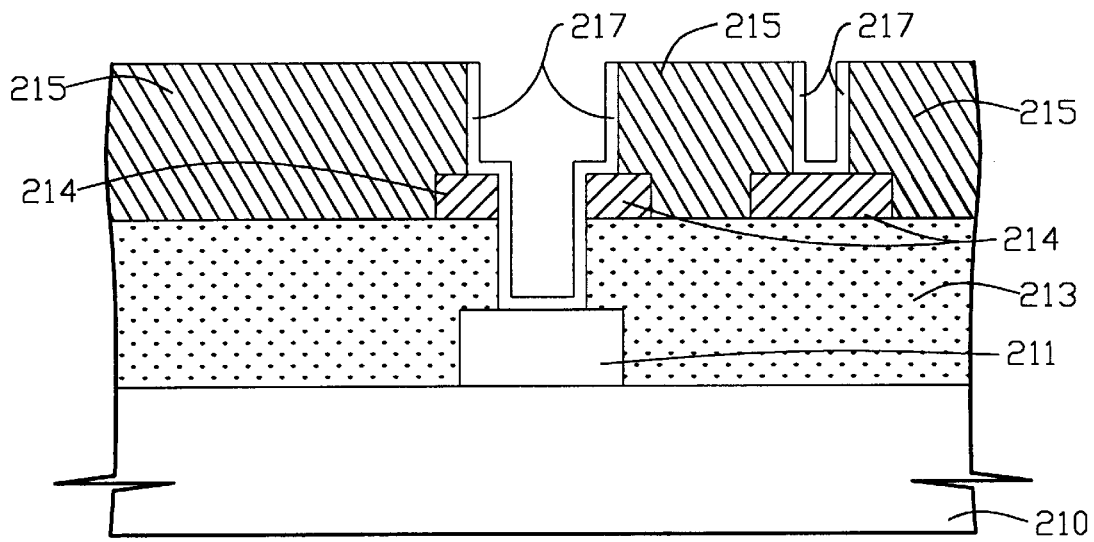

Referring to FIG. 2G, a tantalum nitride layer (specified barrier layer) 217 is deposited into and formed on top surface of trenches 216$a$ and 216$b$ by conventional method, such as plasma enhanced chemical vapor deposition method. This layer 217 will overlap the above trenches and the thickness of this layer 62 is between about 100 to 500 angstroms, as a thin film cover for next via using.

Figure 2H:
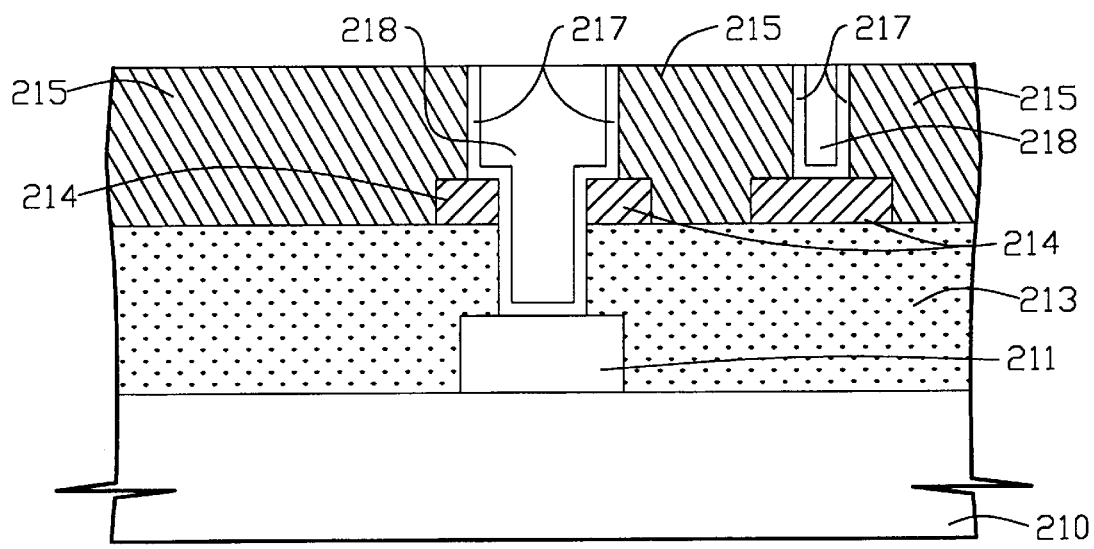

The dual damascene metal interconnect of FIG. 2H is finally formed by seeding and fulfilling second metal 218 into the horizontal line trench and planarizing the same. The planarizing can be achieved by conventional chemical mechanical polishing. The material of second metal 218 is copper or aluminium—copper alloy.

Thus, the advantages according to the preferred embodiment will be described as the following:

1. Tantalum nitride is used as an etching stop layer, therefore the high-k SiN layer can be skipped for via/trench formation.
2. The via/trench structure can be formed by one-step etching process using Tantalum nitride layer.
3. Combination with low k dielectric layer, the structure can be applied to sub-0.18 $\mu$m technology for reducing RC delay.

Also, In accordance with the present invention, a method is provided for forming inter-metal dielectric layer using dual damascene structure that substantially obtains larger lithography process window without etching stop layer, i.e., PR lithography can be well controlled. It is therefore an objection of this invention that with high height of photoresist and low height of SOG Oxide, via/trench etching is not necessary; thus, plasma damage on low k dielectric layer is avoided.

There is another object of this invention that silicon nitride stop layer is not used because damascene structure can be formed by two steps photoresist lithography. It is still another object of this invention that no via overetch issue (two steps trench/via etching); thus, process window of alignment adjustment (AA) control is improved. Especially, there is yet another object of this invention that combination with low-dielectric constant layer, this process is very compatible with sub-0.18 $\mu$m technology.

From the above description, the present invention could be summarized as the following. First of all, a semiconductor wafer is provided. Then, forming a first metal layer on a portion of the substrate is carried out. A first dielectric layer is formed on the first metal layer and the substrate. Consequentially a tantalum nitride layer is formed on the first dielectric layer. A first photoresist layer can be formed on the tantalum nitride layer, especially first photoresist layer has a first pattern defining a trench area located over the first metal layer, and has a second pattern defining an etch stop area. The tantalum nitride layer will be etched by the first photoresist layer. A second dielectric layer is formed over the etched tantalum nitride layer and the first dielectric layer. The second photoresist layer can be formed on the second dielectric layer, sepecially the second photoresist layer has a first pattern substantially aligned with the first pattern of the first photoresist layer, and has a second pattern substantially aligned with the second pattern of the first photoresist layer. Next, etching the second dielectric layer by the second photoresist layer can be achieved, portion of the first dielectric layer over the first metal layer is further etched by the first pattern of the first photoresist layer. Thus trenches are formed in the first dielectric layer and the second dielectric layer. Then the tantalum nitride layer is deposited into the trenches, especially barrier layer is formed on top surface of the trenches. A seed layer is formed on sidewalls of the etched first dielectric layer and the second dielectric layer. Sequentially, the trenches are filled by a second metal layer. Finally, the second metal layer is planarized to expose surface of said second dielectric layer.

Although specific embodiments have been illustrated and described, it will be obvious to those skilled in the art that various modifications may be made without departing from what is intended to be limited solely by the appended claims.

What is claimed is:

1. A method for forming interconnect, comprising:
   providing a semiconductor substrate;
   forming a first metal layer on a portion of said substrate;
   forming a first dielectric layer on said first metal layer and said substrate;
   forming a barrier layer on said first dielectric layer;
   forming a first photoresist layer on said barrier layer, wherein said first photoresist layer has a first pattern defining a trench area located over said first metal layer, and has a second pattern defining an etch stop area;
   etching said barrier layer by the first photoresist layer;
   forming a second dielectric layer over the etched barrier layer and the first dielectric layer;
   forming a second photoresist layer on said second dielectric layer, wherein said second photoresist layer has a first pattern substantially aligned with the first pattern of said first photoresist layer, and has a second pattern substantially aligned with the second pattern of said first photoresist layer;
   etching the second dielectric layer by the second photoresist layer, portion of said first dielectric layer over said first metal layer being further etched by the first pattern of the first photoresist layer, thereby trenches being formed in the first dielectric layer and the second dielectric layer;
   depositing said barrier layer into said trenches, wherein said barrier layer being formed on top surface of said trenches;
   forming a seed layer on sidewalls of the etched first dielectric layer and the second dielectric layer;
   filling the trenches by a second metal layer, wherein said second metal layer is selected from the group consisting of a copper alloy layer and an aluminium—copper alloy; and
   planarizing said second metal layer to expose surface of said second dielectric layer.

2. The method according to claim 1, wherein said first photoresist layer has a thickness between about 5000 to 15000 angstroms.

3. The method according to claim 1, wherein said second photoresist layer has a thickness between about 5000 to 15000 angstroms.

4. The method according to claim 1, wherein said first dielectric layer is low-dielectric constant and has a thickness between about 4000 to 12000 angstroms.

5. The method according to claim 1, wherein said second dielectric layer is low-dielectric constant and has a thickness between about 4000 to 12000 angstroms.

6. The method according to claim 1, wherein said specified barrier comprises tantalum nitride.

7. The method according to claim 1, wherein said planarizing said second metal comprises chemical mechanical polishing.

8. A method for forming interconnect, comprising:
   providing a semiconductor substrate;
   forming a first metal layer on a portion of said substrate;
   forming a first dielectric layer on said first metal layer and said substrate;
   forming a tantalum nitride layer on said first dielectric layer;
   forming a first photoresist layer on said tantalum nitride layer, wherein said first photoresist layer has a first pattern defining a trench area located over said first metal layer, and has a second pattern defining an etch stop area;
   etching said tantalum nitride layer by the first photoresist layer;
   forming a second dielectric layer over the etched tantalum nitride layer and the first dielectric layer;
   forming a second photoresist layer on said second dielectric layer, wherein said second photoresist layer has a first pattern substantially aligned with the first pattern of said first photoresist layer, and has a second pattern substantially aligned with the second pattern of said first photoresist layer;
   etching the second dielectric layer by the second photoresist layer, portion of said first dielectric layer over said first metal layer being further etched by the first pattern of the first photoresist layer, thereby trenches being formed in the first dielectric layer and the second dielectric layer;
   depositing said tantalum nitride layer into said trenches, wherein said barrier layer being formed on top surface of said trenches;
   forming a seed layer on sidewalls of the etched first dielectric layer and the second dielectric layer;
   filling the trenches by a second metal layer; and
   planarizing said second metal layer to expose surface of said second dielectric layer.

9. The method according to claim 8, wherein said first photoresist layer has a thickness between about 5000 to 15000 angstroms.

10. The method according to claim 8, wherein said second photoresist layer has a thickness between about 5000 to 15000 angstroms.

11. The method according to claim 8, wherein said first dielectric layer is low-dielectric constant (and has a thickness between about 4000 to 12000 angstroms).

12. The method according to claim 8, wherein said second dielectric layer is low-dielectric constant (and has a thickness between about 4000 to 12000 angstroms).

13. The method according to claim 8, wherein said second metal comprises aluminium—copper alloy.

14. The method according to claim 8, wherein said planarizing said second metal comprises chemical mechanical polishing.

\* \* \* \* \*